US009245912B2

(12) United States Patent
Kao et al.

(10) Patent No.: US 9,245,912 B2
(45) Date of Patent: Jan. 26, 2016

(54) METHOD AND APPARATUS FOR LOW RESISTANCE IMAGE SENSOR CONTACT

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Feng-Chi Hung, Chu-Bei (TW); Chun-Chieh Chuang, Tainan (TW); Shuang-Ji Tsai, Tainan (TW); Jeng-Shyan Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 128 days.

(21) Appl. No.: 13/890,763

(22) Filed: May 9, 2013

(65) Prior Publication Data

US 2014/0264504 A1    Sep. 18, 2014

Related U.S. Application Data

(60) Provisional application No. 61/778,319, filed on Mar. 12, 2013.

(51) Int. Cl.
*H01L 27/146*   (2006.01)

(52) U.S. Cl.
CPC ...... *H01L 27/14601* (2013.01); *H01L 27/1464* (2013.01); *H01L 27/14612* (2013.01); *H01L 27/14632* (2013.01); *H01L 27/14634* (2013.01)

(58) Field of Classification Search
None
See application file for complete search history.

(56) References Cited

U.S. PATENT DOCUMENTS

| | | | | |
|---|---|---|---|---|
| 2011/0090383 | A1* | 4/2011 | Yamaguchi | H01L 27/14632 348/294 |
| 2012/0098078 | A1* | 4/2012 | Shim | H01L 27/14621 257/432 |
| 2012/0205730 | A1* | 8/2012 | Chen | H01L 27/14609 257/292 |
| 2012/0248560 | A1* | 10/2012 | Lee | H01L 27/1464 257/432 |

* cited by examiner

*Primary Examiner* — Steven Loke
*Assistant Examiner* — Juanita Rhodes
(74) *Attorney, Agent, or Firm* — Slater & Matsil, L.L.P.

(57) ABSTRACT

A method and apparatus for a low resistance image sensor contact, the apparatus comprising a photosensor disposed in a substrate, a first ground well disposed in a first region of the substrate, the first ground well having a resistance lower than the substrate, and a ground line disposed in a region adjacent to the first ground well. The first ground well is configured to provide a low resistance path to the ground line from the substrate for excess free carriers in the first region of the substrate. The apparatus may optionally comprise a second ground well having a lower resistance than the first ground well and disposed between the first ground well and the ground line, and may further optionally comprise a third ground well having a lower resistance than the second ground well and disposed between the second ground well and the ground line.

20 Claims, 11 Drawing Sheets

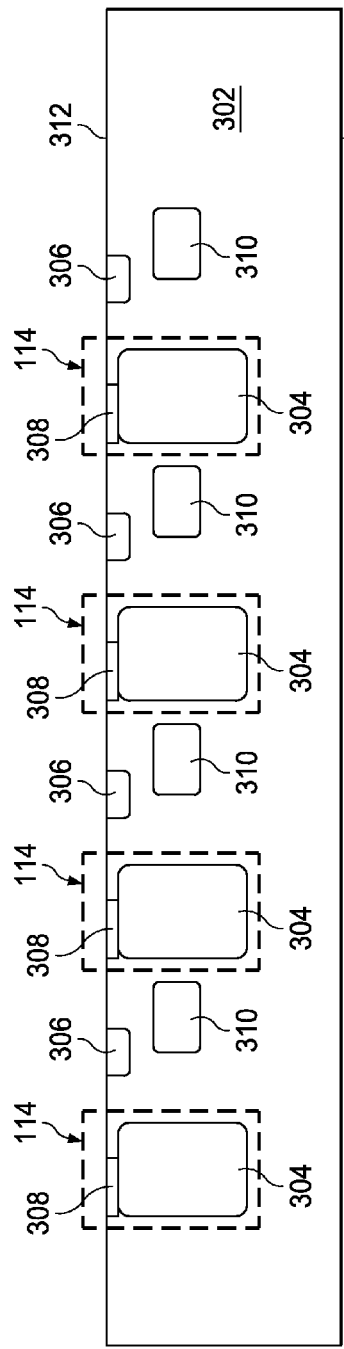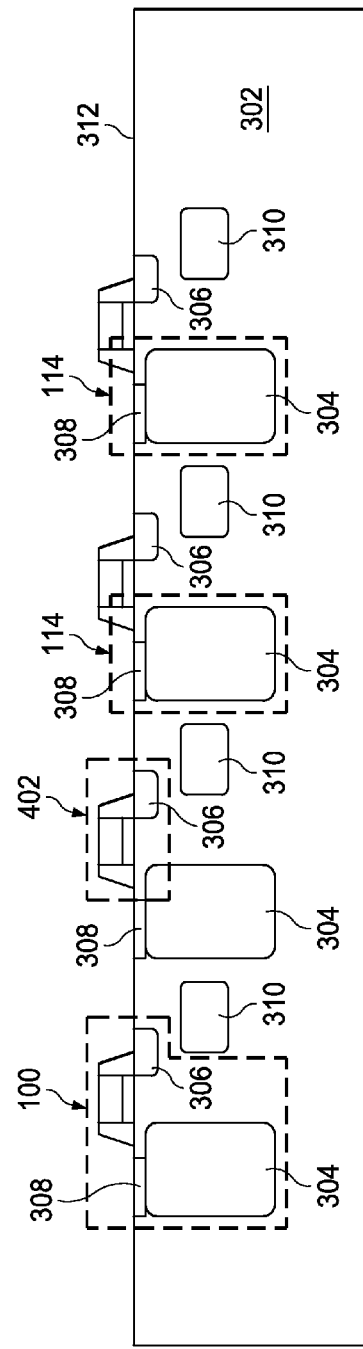

METHOD AND APPARATUS FOR LOW RESISTANCE IMAGE SENSOR CONTACT

CROSS-REFERENCE TO RELATED APPLICATIONS

The present application claims the benefit of U.S. Provisional Patent Application No. 61/778,319 filed Mar. 12, 2013 and entitled "Method and Apparatus for Low Resistance Image Sensor Contact," which is incorporated herein by reference as if reproduced in its entirety.

BACKGROUND

A Metal-oxide semiconductor (MOS) image sensor typically comprises an array of picture elements (pixels), which utilizes light-sensitive MOS circuitry to convert photons into electrons. The light-sensitive MOS circuitry typically comprises a photodiode formed in a silicon substrate. As the photodiode is exposed to light, an electrical charge is induced in the photodiode. Each sensor, or pixel, may generate electrons proportional to the amount of light that falls on the pixel when light is incident on the pixel from a subject scene. The electrons are converted into a voltage signal in the pixel and further transformed into a digital signal which will be processed by an application specific integrated circuit (ASIC) or other circuitry.

A MOS image sensor, or simply a MOS sensor, may have a front side where a plurality of dielectric layers and interconnect layers are located connecting the photodiode in the substrate to peripheral circuitry, and a backside having the substrate. A MOS sensor is a front-side illuminated (FSI) image sensor if the light is from the front side of the sensor; otherwise it is a back-side illuminated (BSI) sensor with light incident on the backside. For a BSI sensor, light can hit the photodiode through a direct path without the obstructions from the dielectric layers interconnects located at the front side, which helps to increase the number of photons converted into electrons, and makes the MOS sensor more sensitive to the light source.

Three-dimensional (3D) integrated circuits (ICs) may be used to achieve a high density required for current applications, such as image sensor applications. When a MOS sensor is packaged in a 3D IC, there are challenges related to forming the 3D IC.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 3-8 are cross-sectional views of an image sensor device in intermediate steps of production according to an embodiment;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the illustrative embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, an image sensor with a ground well providing a low resistance path to drain excess free carriers. The embodiments of the disclosure may also be applied, however, to a variety of image sensors and semiconductor devices. Hereinafter, various embodiments will be explained in detail with reference to the accompanying drawings.

Image sensors generally use control circuitry in order to access multiple individual pixels. A photodiode generates free carriers, which are transferred from the photodiode by a transfer gate. The carrier flowing out of the photodiode are translated into a color value for that particular pixel. However, operation of the photodiode and transfer gate may result in excess free carriers trapped in the substrate. The excess carriers may result in crosstalk between pixels and inaccurate readings in pixels when the excess carriers migrate into a photodiode.

One parameter affecting the performance of a pixel array is the fill factor, or area of a particular sensor occupied by each individual pixel. Larger pixels permit greater light sensitivity, and consequently, greater image quality. Larger pixels in a smaller die give a greater fill factor and results in greater performance-per-area. However, larger image sensors result in increased excess free carriers. One embodiment of the presented disclosure is where the substrate is grounded to drain excess free carrier with a ground contact connected to the substrate in a low resistance region, permitting free carrier in the substrate to be removed via the ground contact.

While the sensors forming the pixel array may be described as being complimentary metal oxide semiconductor elements, the pixel array may be comprised of charge coupled devices (CCDs) or any other photosensitive element.

Figure 1:
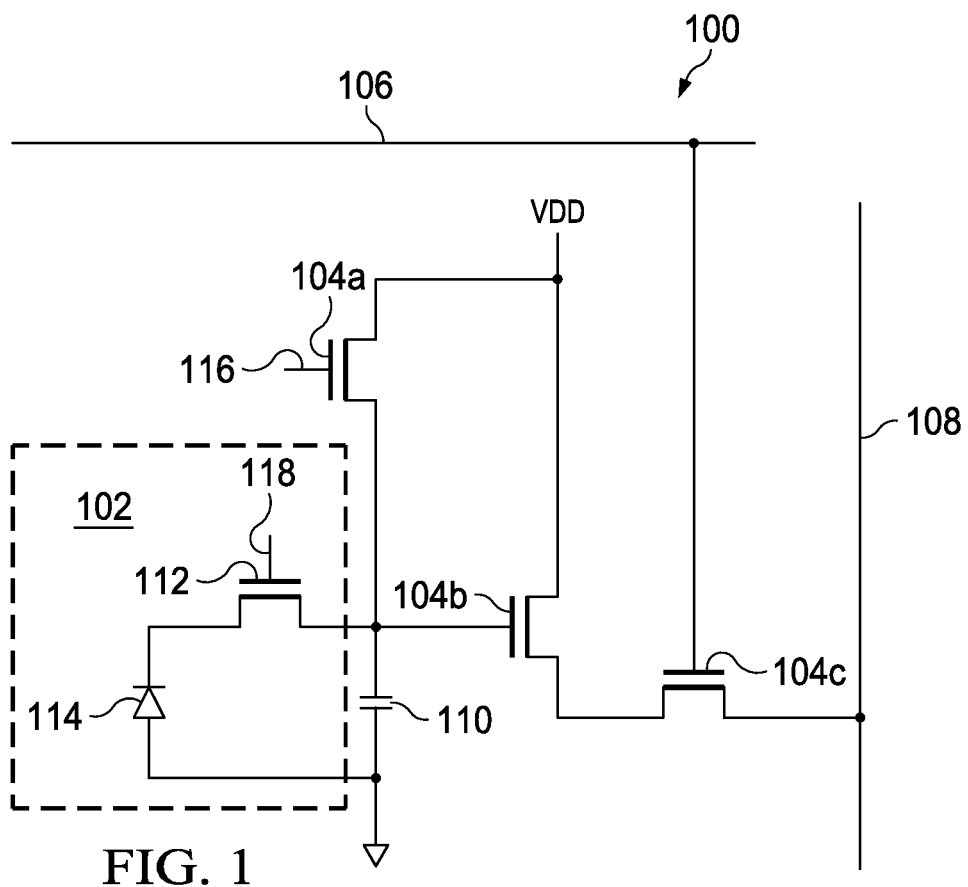
FIG. 1 is a circuit diagram illustrating embodiments of a circuit for controlling and reading a MOS sensor pixel according.

FIG. 1 is a circuit diagram illustrating embodiments of a MOS sensor pixel 100 circuit comprising a photosensor 102 and pixel control circuit. In an embodiment, the photosensor 102 comprises a photodiode 114 and a transfer transistor 112 connected in series. In particular, the photodiode 114 may act as a source for the transfer transistor 112, with the gate of the transfer transistor 112 permitting electrons from the photodiode 114 to flow through the transfer transistor 112 when activated. In an embodiment, the transfer transistor 112 and has a gate coupled to a transfer line 118.

In an embodiment, a pixel control circuit comprises a reset transistor 104a, a source follower 104b and a select transistor 104c. The drain of the transfer transistor 112 is coupled to a drain of the reset transistor 104a and a gate of the source follower 104b. The reset transistor 104a has a gate coupled to a reset line 116. A source of the reset transistor 104a is coupled to a voltage source VDD. The reset transistor 104a is used to preset the voltage at the gate of the source follower 104b. A source of the source follower 104b is coupled to the voltage source VDD, and a drain of the source follower 104b is coupled to the source of the select transistor 104c. The source follower 104b provides a high impedance output for the pixel 100. A gate of the select transistor 104c is coupled to a row select line 106. A drain of the select transistor 104c is coupled to an output line 108, which is coupled to a readout control circuit (not shown).

In operation, light strikes the photosensitive region of the photodiode 114. As a consequence, the photodiode 114 generates an electrical charge proportional to the intensity or brightness of light. The electrical charge comprises free carriers transferred out of the photodiode 114 by enabling the transfer transistor 112 through a transfer signal applied to the gate of the transfer transistor 112. The electrical charge transferred from the photodiode 114 by the transfer transistor 112 enables the source follower transistor 104b, thereby allowing an electrical charge proportional to the charge generated by the photodiode 114 to pass from the voltage source VDD through the source follower 104b to the select transistor 104c. When sampling is desired, the row select line 106 is enabled, allowing the electrical charge to flow through the select transistor 104c to the data process circuits (not shown) coupled to the output of the select transistor 104c.

It should be noted that FIG. 1 illustrates a schematic diagram of a single pixel 100 in an image sensor. It should further be noted while FIG. 1 illustrates a pixel in a four-transistor structure; a person skilled in art will recognize that the four-transistor diagram is merely an example, which should not unduly limit the scope of the claims. One of ordinary skill in the art would recognize many variations, alternatives, and modifications. For example, various embodiments may include but not limited to three-transistor pixel, five-transistor pixel, a charge couple device (CCD) sensor, and the like.

Figure 2:
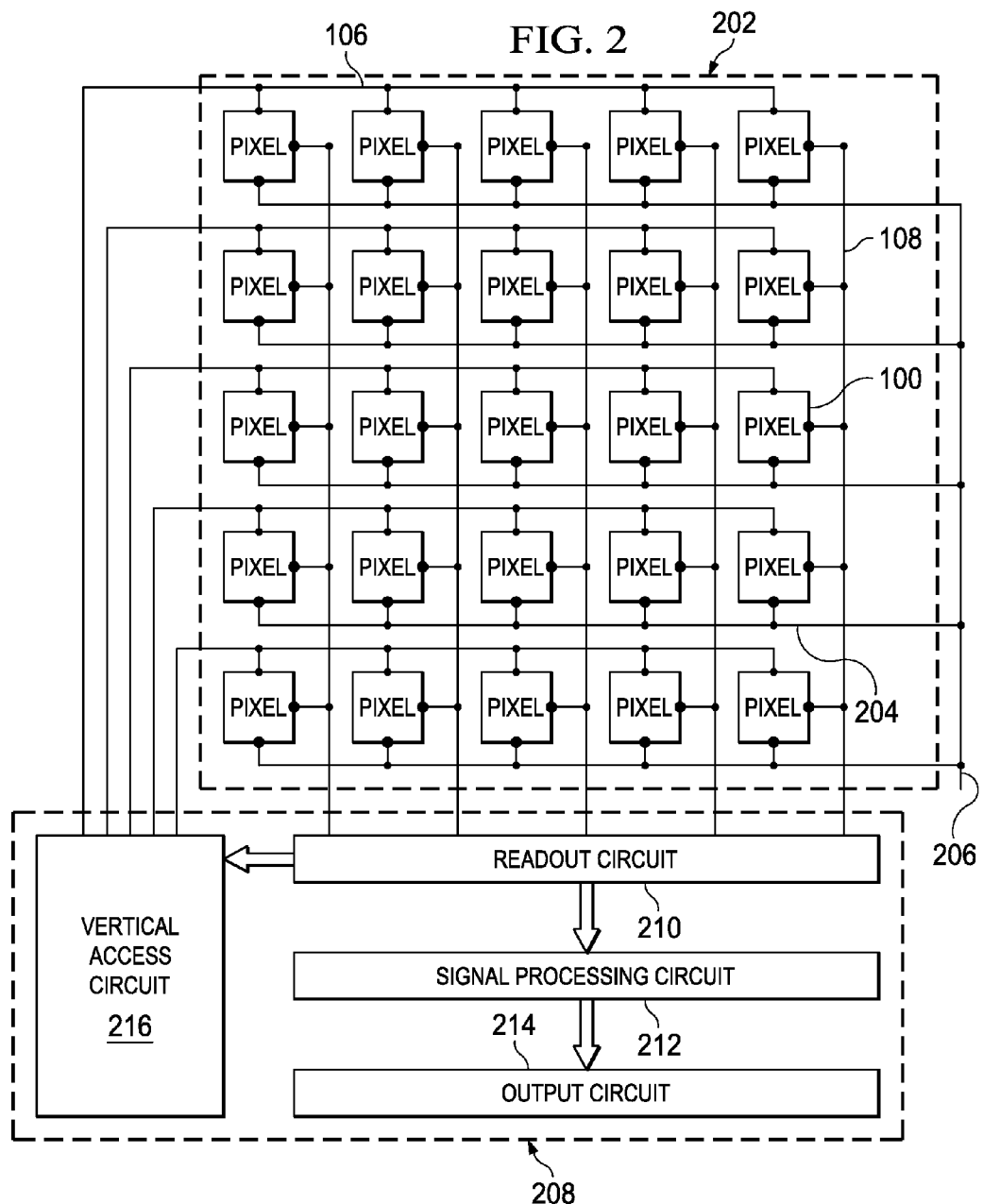
FIG. 2 is a logical diagram illustrating embodiments of a pixel array and associated circuitry.

FIG. 2 is a logical diagram illustrating embodiments of an array of pixels 100 and associated circuitry. An embodiment of a sensor 202 may comprise a plurality of pixels 100 or sensor elements, such as the pixel 100 illustrated in FIG. 1. In an embodiment, the pixels 100 may be arranged to form a two dimensional pixel array. The illustrated sensor 202 depicts a pixel array of size 5*5 by way of simplified example. Skilled practitioners will readily recognize that the presented embodiments may be applied to any size of pixel array without deviating from the embodied principles.

To reduce the number of connections required to address all pixels in a large array of pixels, individual pixels 100 may be read in multiplexed fashion, with a circuit controlling which row of a pixel array is addressed and separate circuitry controlling which column of a pixel array is addressed. Thus, a single pixel 100 at an activated row and column may be read. Addressing each pixel 100 in sequence permits the control circuitry to assemble a graphic image using data collected from individual pixels. The sensor 202 may also comprise the associated connection lines such as the row select lines 106 and output lines 108. For example, each column of pixels 100 may share an interconnection or an output line 108. Thus, a value of a pixel 100 may be read from the output line 108 when a row of pixels 100 is activated by way of a row select line 106, with the output value coming from the pixel 100 in the column intersecting the activated row.

Additionally, a ground trace 206 may be connected to one or more row ground traces 204. A row ground trace 204 may be a conductive line that connects to a ground contact or via of individual pixels 100 to ground the bulk or substrate near each pixel 100. While FIG. 2 shows a contact for each individual pixel 102, skilled artisans will recognize that groups of pixels 100 may be grounded by a single contact, or that a single ground contact may ground an entire pixel array. The ground trace may be connected to a ground or low voltage source, such as a Vss input to drain excess free carrier from the substrate.

In an embodiment, the control circuit 208 may comprise a readout circuit 210 to read the signals from the pixel 100 array. The readout signals will be processed by a signal processing circuit 212. The processed signals are used to generate the output for the image sensor application by an output circuit 214. Other circuits such as a vertical access circuit 216 may be part of the control circuit 208 as well. In an embodiment, the vertical access circuit 216 may apply a voltage to one of the row select lines 106 to activate a row of pixels 100 so that the pixel value may be read on the output line 108.

FIGS. 3-9 are cross-sectional view of an image sensor device in intermediate steps of production according to an embodiment. Referring first to FIG. 3, there is shown a substrate 302. The substrate 302 may be a wafer, die, or the like. The substrate 302 may include one or more photodiodes 114, each corresponding to a pixel 100. The photodiode 114 may be comprised of a photosensitive region 304 and a surface layer 308 forming a p-n junction. In an embodiment, the photodiode 114 may be a pinned photodiode. A drain region 306 may also be implanted for each pixel 100, with the drain region 306 and photodiode 114 acting as the drain and source regions, respectively, for a transfer transistor 112 (FIG. 1) as described in greater detail below.

One or more ground wells 310 may also be created. In an embodiment, the resistance of the ground well 310 will be lower than that of the substrate 302, permitting excess free carriers to be drained or released from the substrate by way of a ground contact (See FIG. 5, element 504a). The ground well 310 may be implanted so that it is separated from, or avoids, the photodiode 114 and drain region 306. Additionally, the ground well 310 may be disposed under a portion of the drain region 306, or arranged in another location with respect to the photodiode 114 and drain region 306. For example, in an embodiment, the ground well 310 may be disposed adjacent to the drain region 306, between the drain region 306 and photodiode 114 in the substrate 302 bulk, or under the photodiode 114. In another embodiment, the ground well 310 may be an epitaxial layer or a buried layer in the substrate 302, and for example, may extend under multiple photodiodes and drain regions 306. In such an embodiment, the ground well 310 maybe epitaxially grown on, for example, the backside of a substrate 302 or on a carrier with the substrate 302 subsequently grown over the ground well 310. In another such embodiment, the ground well may be formed by implanting a dopant or semiconductor into the substrate 302 to form the buried layer.

The ground well 310 may be implanted at a relatively high power, such as 200 keV. In an embodiment, the ground well 310 is doped with a p-type dopant such as boron. In such an embodiment, the boron may be implanted at about 200 keV to a depth of about 0.55 μm, or at about 900 keV to a depth of about 2.15 μm in the substrate 302. It will be recognized that the depth of the ground well 310 may be between about 0.55 μm and about 2.15 μm, and that the depth may be controlled by the implant energy. Furthermore, different ground well 310 dopants may be implanted at different energies to achieve the desired ground well depth. It will also be recognized that the ground well 310 may implanted through the front side 312 or the back side 314 of the substrate 302 based on a number of factors, for example, but not limited to, the desired ground well 310 depth or presence of existing structures prior to implanting the ground well 310. In an embodiment, the ground well 310 may be an epitaxial layer that is epitaxially grown, for example, on the back side 314 on the substrate 302.

In an embodiment, the substrate 302 may be a p-type semiconductor, and the ground well 310 maybe a region having a higher p-type doping concentration, and subsequently, greater carrier mobility and a lower resistance. For example, the substrate 302 may be doped with boron, for example, at a concentration of about $1*10^{15}$ cm$^{-3}$, and the ground well 310 may be doped with boron to a concentration of about $1*10^{16}$ cm$^{-3}$ or greater.

FIG. 4 is a cross-sectional view illustrating formation of a transfer gate 402 for an image sensor device according to an embodiment. The transfer gate 402 may be a gate structure spanning the drain region 306 and photodiode 114 on the fronts side 302 of the substrate 302 to form the pixel 100. The transfer gate 402 may comprise an insulating layer and a gate contact. In an embodiment, the transfer gate 402 may also comprise gate spacers. Additional sensor control circuit transistors and interconnections may also be formed on the substrate 302 and connected to individual pixels 100.

Figure 5:
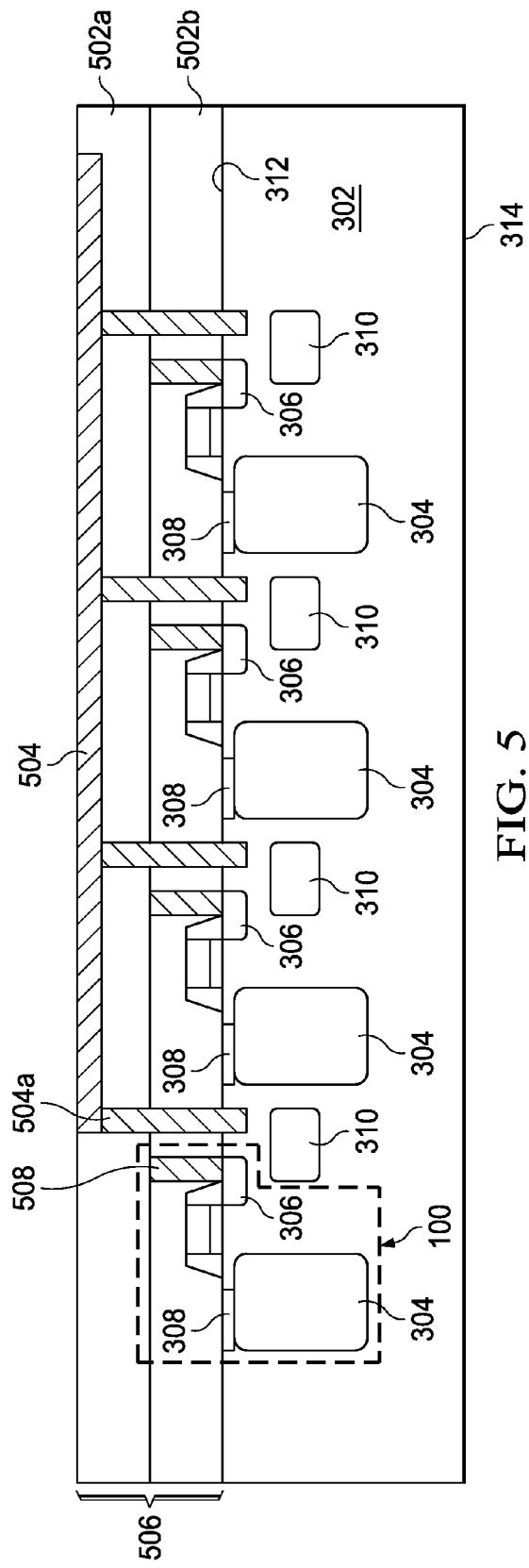

FIG. 5 is a cross-sectional view illustrating formation of one or more interconnect structures 506 according to an embodiment. An interconnect structure 506 may be formed on the front side 312 of the substrate 302. The interconnect structure 506 may be one or more interlayer dielectrics, intermetal dielectrics, metallization layers, redistribution layers (RDLs), or the like, or a combination of the same. The interconnect structure 506 may comprised one or more dielectric layers 502a, 502b with conductive lines 508 and a ground line 504 disposed in a dielectric material. The ground line 504 may comprise one or more ground contacts 504a that extend from a ground line 504 metal trace to a ground region in one or more of the pixels 100. The ground well 310 may be disposed between the ground contact 504a and the bulk of the substrate 302 that is disposed around the photodiode 114 and. In an embodiment, each pixel 100 may have a separate and individual ground well 310. In such an embodiment, the ground line 504 may have multiple ground contacts 504a, each contacting a separate ground well 310.

The ground contact 504a may extend into the substrate 302 into the substrate 302. In an embodiment the ground contact 504a may have an end separate from the ground well 310, or in another embodiment, the ground contact 504a may contact the ground well 310.

In an embodiment, the ground line 504 may be disposed on the backside 314 of the substrate 302, with the ground contact 504a extending to, or through, the backside 314 of the substrate 302 to a region adjacent to the ground well 310, or contacting the ground well 310.

Figure 6:
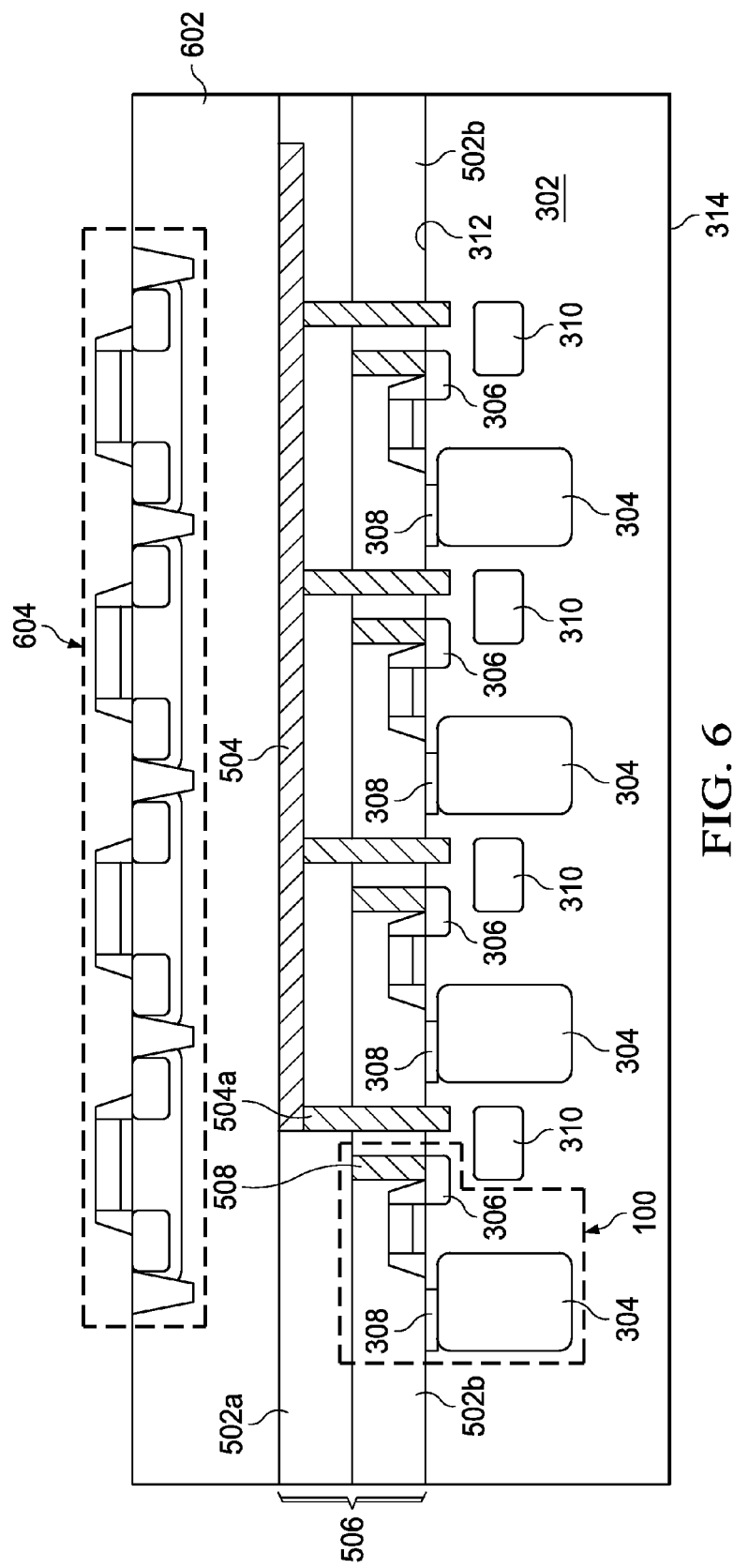

FIG. 6 is a cross-sectional view of formation of control elements 604. One or more control elements 604 may be disposed in a control element substrate 602. The control elements 604 may be pixel control transistors such as reset transistors 104a (FIG. 1), source followers 104b (FIG. 1), select transistors 104c (FIG. 1), or a combination of the different pixel control transistors. In an embodiment, the control elements 604 may be one or more elements from the control circuit 208 (FIG. 2). Additionally, in an embodiment, the control elements 604 may be formed in situ, or formed on a separate die and then bonded to the interconnect structure over the pixels 100.

Figure 7:
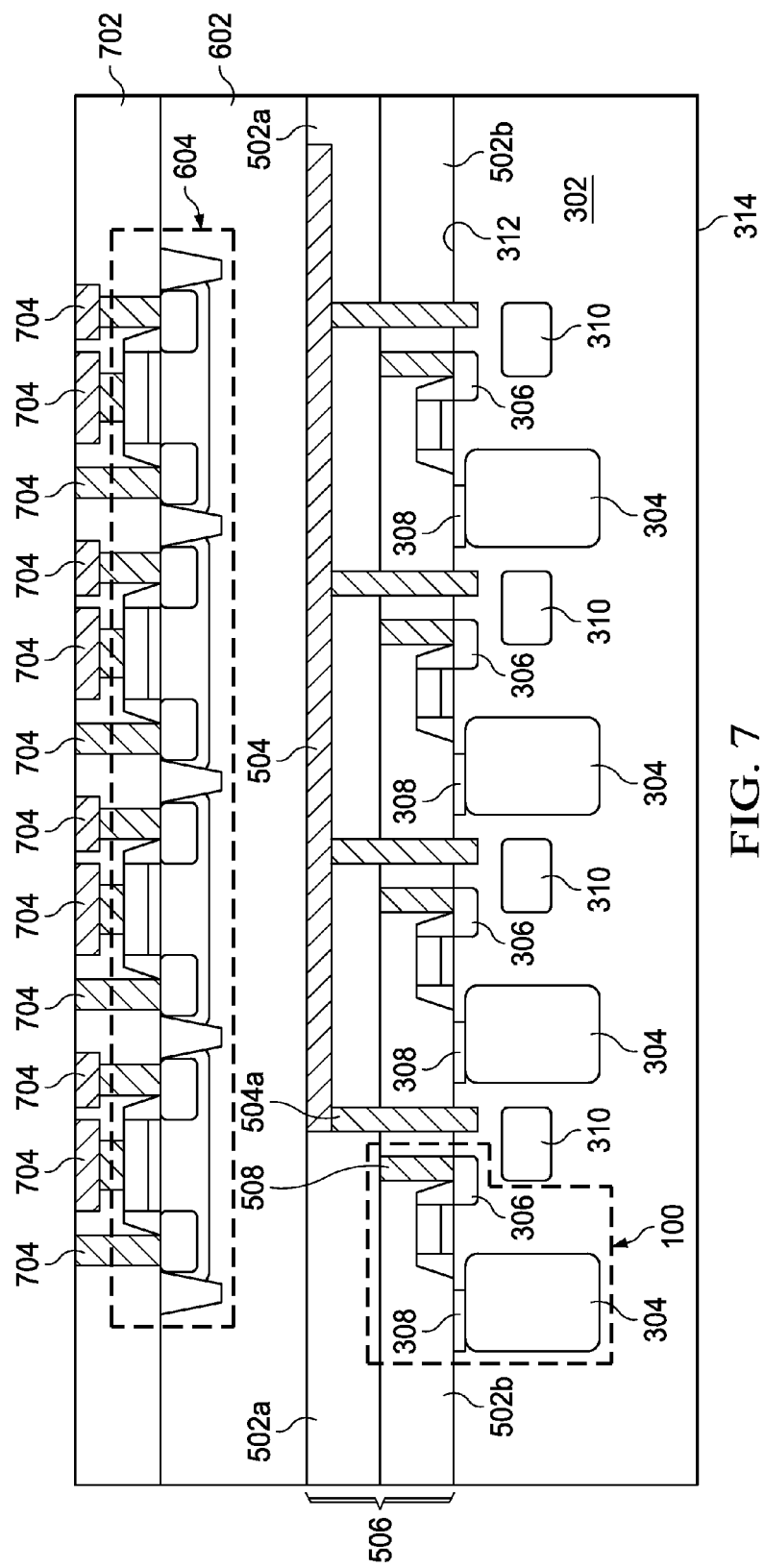

FIG. 7 is a cross-sectional view of formation of a second interconnect structure 702. A second interconnect structure 702 may be formed over the control elements 604. A dielectric layer having one or more redistribution lines 704, contacts, via, or the like may be formed to connect individual control elements 604 to each other, or to other circuits through contact pads or the like. The second interconnect structure 702 may be one or more interlayer dielectrics, intermetal dielectrics, metallization layers, RDLs, or the like, or a combination of the same.

Figure 8:
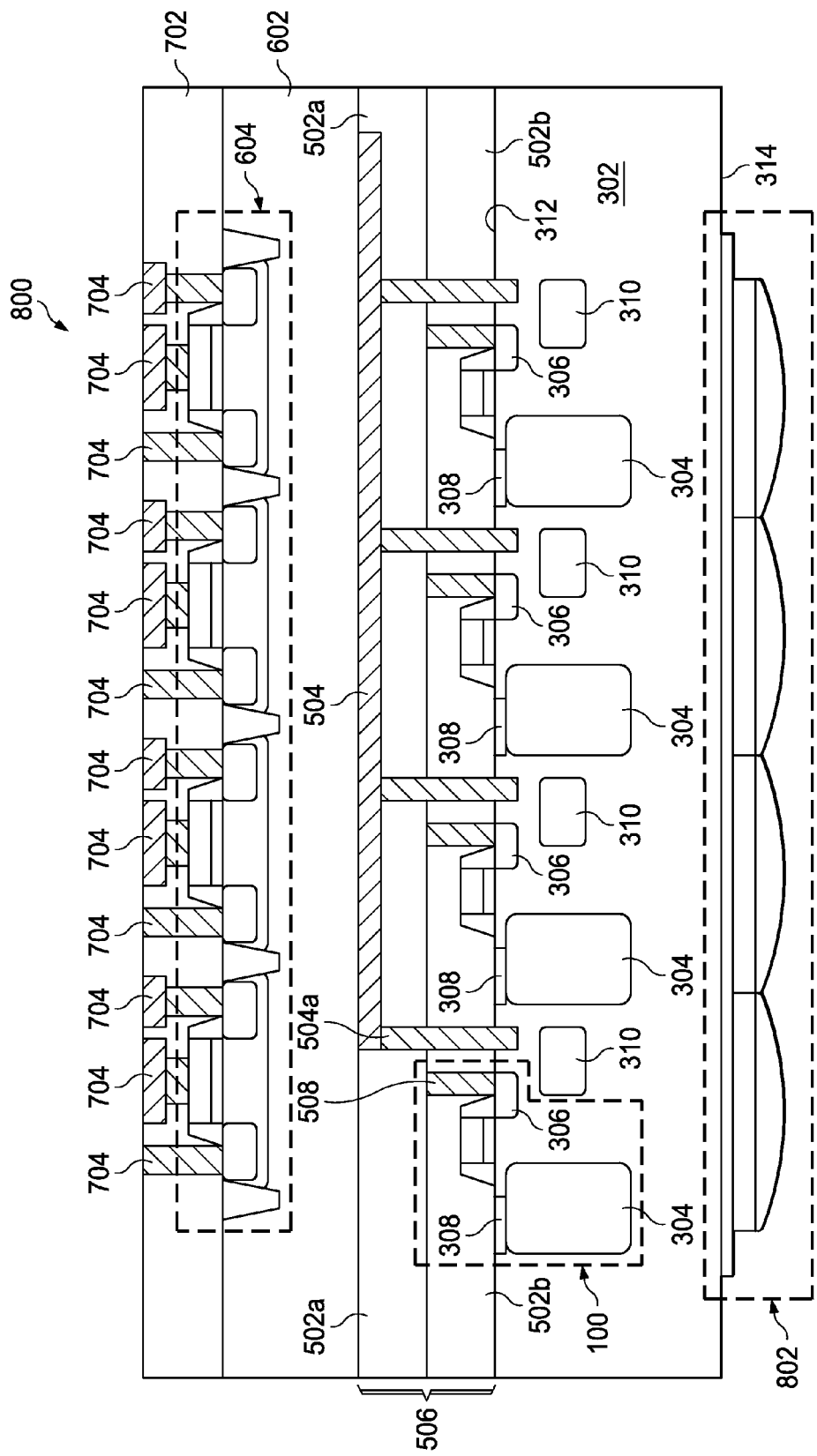

FIG. 8 is a cross-sectional view of a sensor package 800 with filters and lenses according to an embodiment. The sensor substrate 302 is thinned at the backside 314 until the sensor substrate 302 reaches a predetermined thickness. Such a thinned sensor substrate 302 allows light to pass through the substrate and hit the photosensitive regions 304 of the pixel embedded in the sensor substrate 302 without being absorbed by the sensor substrate 302.

The embodiment illustrated in FIGS. 3-8 illustrate a BSI sensor, where light enters the back side 314 of the substrate to hit the photodiode 114 without obstructions from dielectric layers interconnects located at the front side 312. In such an embodiment, the thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the backside of the sensor substrate 302 and a grinding pad (not shown) is used to grind away the backside of the sensor substrate 302 until a desired thickness is achieved.

In an embodiment, an optical structure 802 may be applied to the backside 314 of the substrate 302, and may comprise, for example, an optical coating such as an antireflective coating, a color filter layer, or one or more microlenses.

While the embodiments illustrated herein show BSI sensors with ground wells 310, it will be recognized that embodiments encompassing front side illuminated sensors may be achieved without deviating from the teachings herein.

Figure 9A:
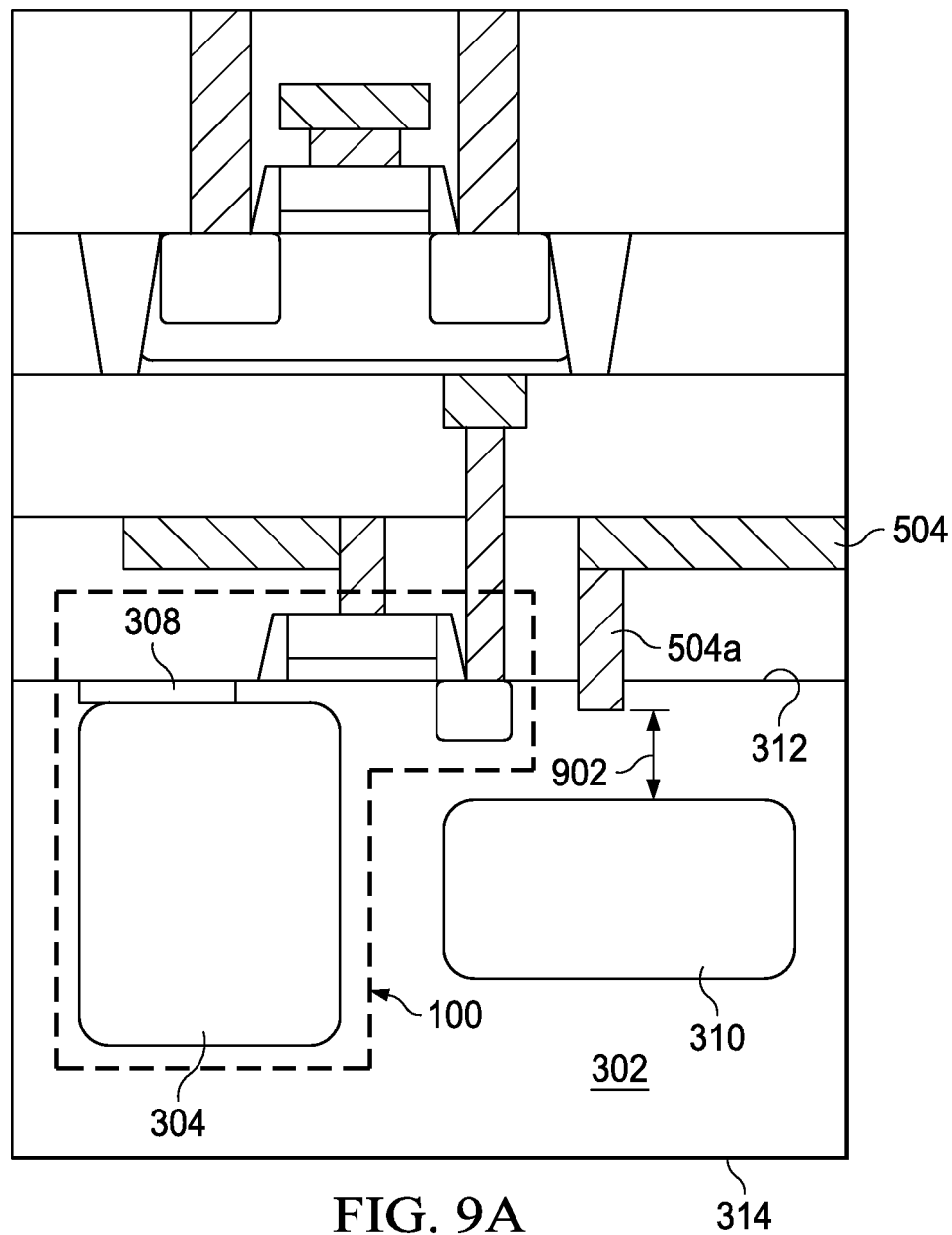
FIGS. 9A-9C are cross-sectional views of embodiments of ground wells for image sensors.

FIG. 9A is a cross-sectional view of a pixel 100 and ground well 310 according to an embodiment. In such an embodiment, a ground well 310 may be disposed in the substrate 302, with the ground well separated from the ground contact 504a by a first distance 902. For example, where boron is implanted at 900 keV, the ground well 310 may be separated by a first distance 902 of about 2.15 µm or less. In such an embodiment, the ground contact 504a may extend from a trace of the ground line 504 to, or through, the front side 312 of the substrate 302. The ground contact 504a may terminate at or near a region adjacent to the ground well 310 without contacting the ground well 310. The ground well 310 may be doped to provide a low resistance path to a region near the ground contact 504a, permitting excess free carrier in the substrate 302 to migrate to the ground contact 504a.

Figure 9B:
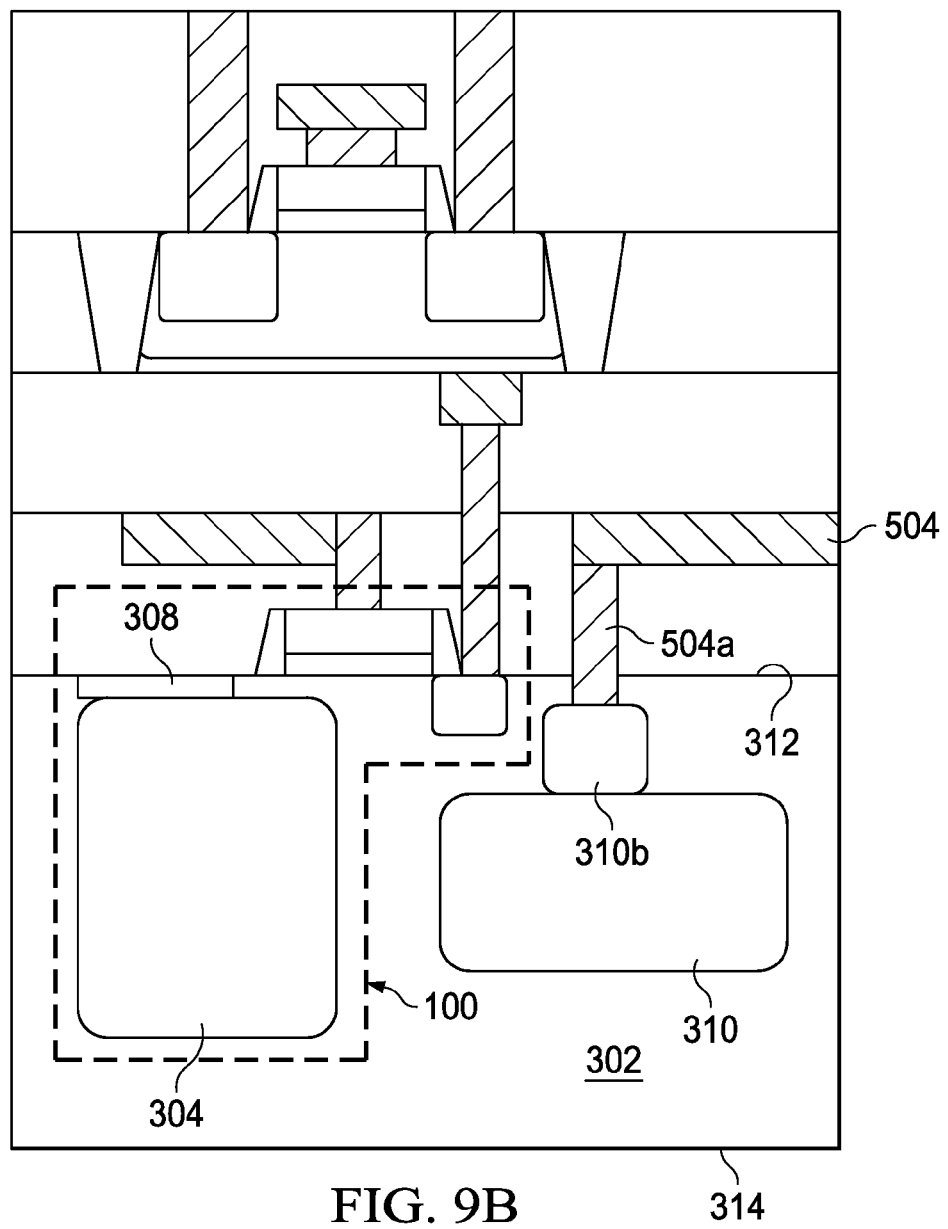

FIG. 9B is a cross-sectional view of a pixel 100 and with a second ground well 310b according to an embodiment. In such an embodiment, a ground well 310 may be disposed in the substrate 302, and a second ground well 310b disposed between the ground contact 504a and the ground well 310. In such an embodiment, the second ground well 310b may be doped to have a resistance lower than the resistance of the ground well 310, and subsequently, lower than the resistance of the substrate 302. For example, the substrate 302 may be doped with boron to a concentration of about $1*10^{15}$ cm$^{-3}$, the ground well 310 may be doped with boron to a concentration between about $1*10^{16}$ cm$^{-3}$ and $1*10^{17}$ cm$^{-3}$, and the second ground well 310b may be doped with boron to a concentration between about $1*10^{17}$ cm$^{-3}$ and $1*10^{18}$ cm$^{-3}$. Such doping profiles provide a series of regions having decreasing resistances leading to the ground contact 504a. For example, a substrate 302 doped with boron at a concentration of $1*10^{15}$ cm$^{-3}$ may have a resistivity of about 1.1 $\Omega$-cm, while a ground well 310 may be doped with boron at about 900 keV to a concentration of about $5*10^{16}$ cm$^{-3}$, resulting in a resistivity of about 0.6 Ω-cm. Such a resistance gradient leading to the ground contact 504a provides for superior excess free carrier release compared to a uniform bulk substrate.

In such an embodiment, the ground contact 504a may extend from a trace of the ground line 504 to, or through the front side 312 of the substrate 302 to the second ground well 310b. The ground trace 504a may terminate or extend to the second ground well 310b, and may optionally contact the second ground well 310b.

Figure 9C:
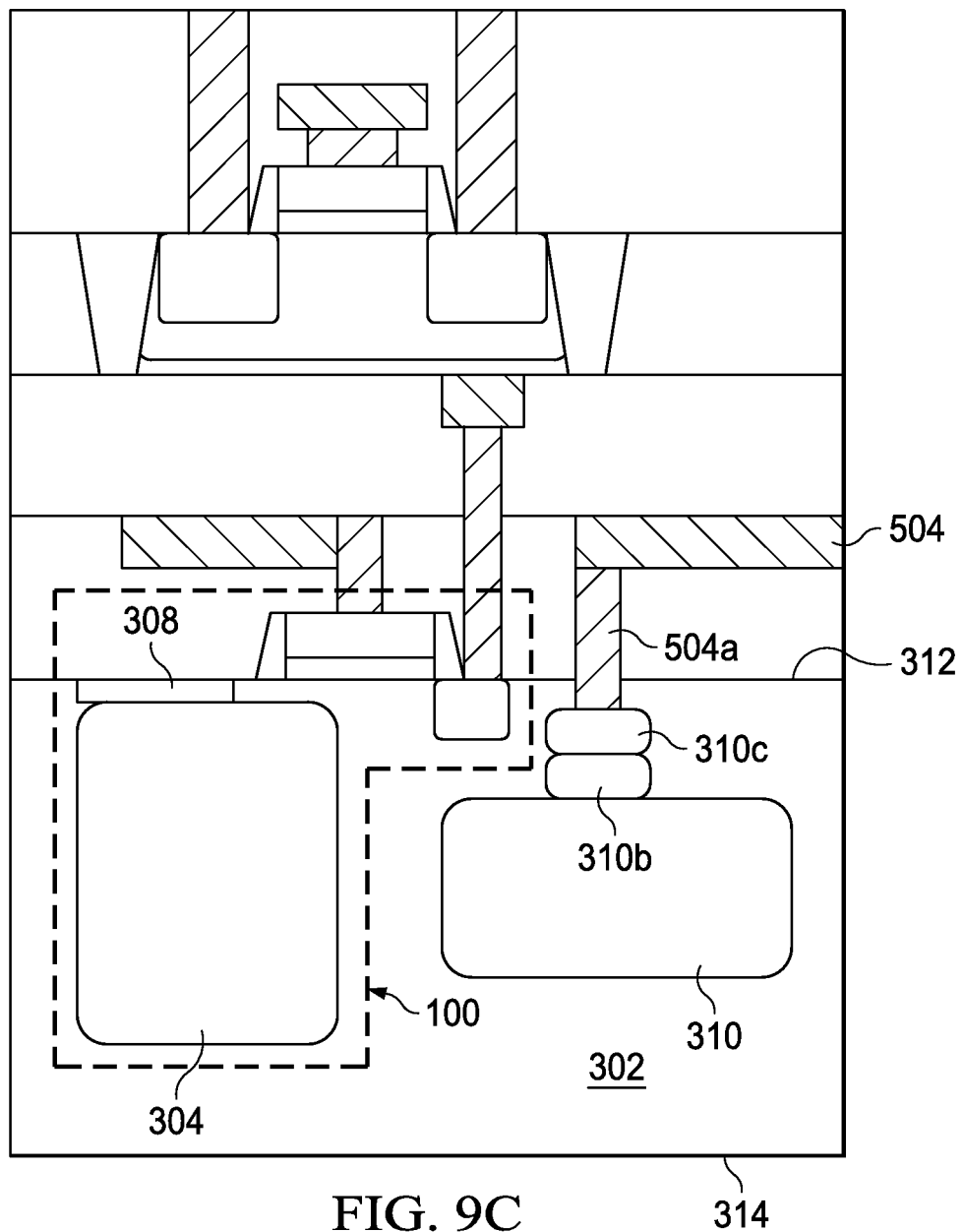

FIG. 9C is a cross-sectional view of a pixel 100 and with a third ground well 310c according to an embodiment. In such an embodiment, a ground well 310 and a second ground well 310b may be disposed in the substrate 302, with a third ground well 310c disposed between the ground contact 504a and the second ground well 310b. In such an embodiment, the third ground well 310c may be doped to have a resistance lower than the second ground well 310b. For example, the substrate 302 may be doped with boron to a concentration of about $1*10^{15}$ cm$^{-3}$, the ground well 310 may be doped with boron to a concentration between about $1*10^{16}$ cm$^{-3}$ and $1*10^{17}$ cm$^{-3}$, the second ground well 310b may be doped with boron to a concentration between about $1*10^{17}$ cm$^{-3}$ and $1*10^{18}$ cm$^{-3}$, and the third ground well 310c may be doped with boron to a concentration between about $1*10^{18}$ cm$^{-3}$ and $1*10^{20}$ cm$^{-3}$. Such doping profiles provide a series of regions having decreasing resistances leading to the ground contact 504a. Additionally, the described doping profiles result in a resistance gradient sufficient to drain excess free carrier in most image sensor devices.

In such an embodiment, the ground contact 504a may extend from a trace of the ground line 504 to, or through, the front side 312 of the substrate 302 to the third ground well 310c without contacting the ground well 310 or the second ground well 310b. Additionally, the second ground well 310b may be disposed between the ground well 310 and the third ground well 310c.

While the aforementioned embodiments have been described herein as p-type ground wells, and a p-type substrate 302, it will be recognized that the embodiments extend to other dopants and n-type conductivities as well. While the doping is described as being performed using boron, another dopant, such as aluminum, gallium, indium, phosphorus, arsenic or the like may be employed. Furthermore, in an embodiment, different ground wells may be doped with different materials, with the doping concentrations adjusted to account for the different material while still providing a resistance gradient. For example, an n-type substrate 302 may be doped with arsenic to about $1*10^{15}$ cm$^{-3}$, the ground well 310 may be doped with arsenic at a concentration between about $1*10^{16}$ cm$^{-3}$ and $1*10^{17}$ cm$^{-3}$, the second ground well 310b may be doped with phosphorus at a concentration between about $8*10^{16}$ cm$^{-3}$ and $1*10^{18}$ cm$^{-3}$, and the third ground well 310c may be doped with phosphorus at a concentration between about $1*10^{18}$ cm$^{-3}$ and $1*10^{20}$ cm$^{-3}$. In such an embodiment, the concentration of phosphorus required to lower the resistance of the second ground well may be reduced since phosphorus lowers the resistance of silicon more than arsenic at a given concentration.

The embodiments presented herein describe ground wells in one, two or three distinct regions. However, it should be recognized that a pixel 102 may have more than three ground wells associated with it, or that the ground wells may have a different distribution, location, or size. Multiple ground wells may intersect, may be separated or may be arranged, for example, laterally with respect to the major surface of the substrate 302. Additionally, while the resistance gradient provided by the ground wells is described herein as generally providing a stepped gradient, it will be recognized that a more linear gradient may be provided by the ground wells. For example, a ground well 310 may be created with a high-dose implant, and then annealed to create wider doping profile with a relatively long tail, resulting in a resistance gradient with a more gradual slop to the resistance changes than multiple discrete ground wells. Such a resistance gradient may be created with one or more ground wells, and may result in a resistance gradient with the lowest ground well 310 resistance nearest the ground contact 504a

Figure 10:
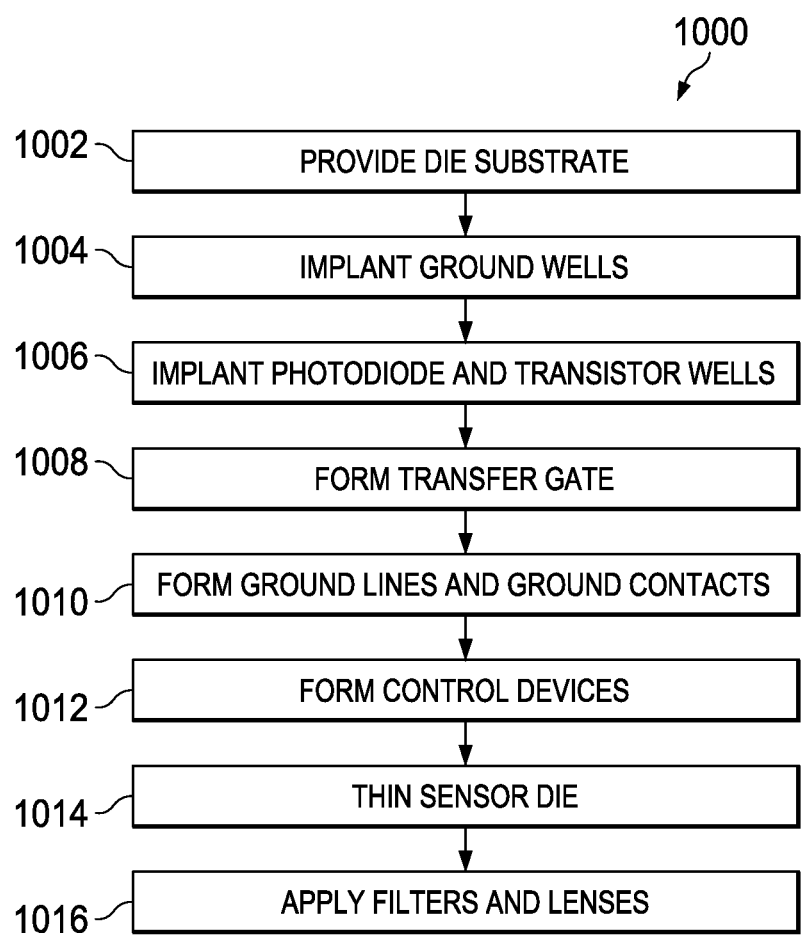
FIG. 10 is a flow chart of a method for forming an image sensor device according to an embodiment.

FIG. 10 is a flow diagram illustrating a method 1000 of forming a sensor package 800. A substrate 302 may be provided in block 1002 and one or more ground wells 310, 310b, 310c implanted or otherwise formed in block 1004. In an embodiment, the substrate 302 may be annealed after implanting the ground wells 310, 310b, 310c, or the ground well 310, 310b, 310c may be driven in or diffused. The photodiode 114 and other transistor wells such as the transfer gate drain region 306 may be implanted in block 1006. The transfer gate 402 may be formed in block 1008 with an interconnect structure 506 comprising one or more dielectric layers 502a, 502b formed over the transfer gate 402. The ground lines 504 with ground contacts 504 may be formed in block 1010. The ground line 504 may be formed in the interconnect structure 506, on the back side 314 of the substrate 302, or on another surface or layer of the device. Control devices are formed in block 1012. The substrate 302 may be thinned at the back side 314 in block 1014, and one or more optical structure 802 formed on the back side 314 of the substrate 302 in block 1016.

Embodiments of devices with one or more ground wells adjacent to a ground contact provide a low resistance path for excess free carriers in the substrate to migrate to the ground contact. The ground wells may be regions separate from transistors or photosensitive regions in the substrate and may have a resistance lower than the bulk substrate. The lower resistance of the ground wells may cause free carriers to be drawn into the ground contact, and away from the transistors or photosensitive regions. Removing the excess free carriers from the substrate provides the benefit of less crosstalk between pixels and fewer inaccurate readings in pixels. Draining the excess carriers prevents those excess carriers from migrating though the substrate between pixels or from the substrate into a photodiode.

While the steps described for the embodiment above are described in an order, it will be recognized that some steps may be performed in alternate orders without deviating from the principles of the embodiments herein. For example, separate ground wells 310, 310b, 310c may be implanted at different times, or ground wells 310, 310b, 310c may be implanted after implanting the photodiode and transistor wells.

Thus, in an embodiment, a device may comprise a photosensor disposed in a substrate, a first ground well disposed in a first region of the substrate, the first ground well having a resistance lower than the substrate, and a ground line disposed in a region adjacent to the first ground well. The first ground well may be configured to provide a low resistance path to the ground line for excess free carriers in the first region of the substrate. The device may further comprise a transfer transistor having a drain region, and the first ground well may be separate from the drain region. The first ground well may be separated from the ground line. The device may further comprise a second ground well disposed between the first ground well and the ground line. The second ground well may have a lower resistance than the first ground well. The device may also further comprise a third ground well disposed between the second ground well and the ground line. The third ground well may have a lower resistance than the second ground well. The first ground well may be an epilayer.

Another embodiment of a device may comprise a substrate having at least one photosensor disposed therein, at least one drain region disposed in the substrate, with each drain region associated with a photosensor. The device may further comprise a ground well in the substrate and separate from the drain region and the photosensor, with the first ground well doped to have a resistance lower than a resistance of the substrate. A ground contact may further be disposed in the substrate adjacent to the first ground well. The device may further comprise a second ground well disposed between the first ground well and the ground contact, with the second ground well doped to have a lower resistance than the resistance of the first ground well and optionally contacting the second ground well. The device may also further comprise a third ground well disposed between the second ground well and the ground contact, the third ground well doped to have a lower resistance than the resistance of the second ground well, and optionally contacting the ground contact. The first ground well and the second ground well may be doped with a different material than the third ground well. The first ground well may be doped to have a resistance gradient with a lowest resistance nearest the ground contact.

A method of forming a device according to an embodiment may comprise forming a first ground well in a substrate, the ground well having a resistance lower than a resistance of the substrate, forming a photosensor in a first region of the substrate and separate from the ground well, and forming a ground contact on the substrate, a portion of the ground line in a region adjacent to the ground well, the ground well configured to provide a low resistance path for free carriers in the first region of the substrate to the ground contact. The method may further comprise forming a second ground well between the first ground well and the ground contact, the second ground well doped to have a lower resistance than the resistance of the first ground well. The method may also further comprise forming a third ground well between the second ground well and the ground contact, the third ground well doped to have a lower resistance than the resistance of the second ground well. The photosensor may be a photodiode, and the method may comprise forming a drain region in the substrate and forming gate structure spanning the drain region and the photodiode to form a transfer gate.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a photosensor disposed in a first region of a substrate;
    a first ground well disposed in the substrate, the first ground well separate from the photosensor and having a resistance lower than the substrate; and
    a metal trace ground line in a dielectric layer on an upper surface of the substrate away from the photosensor in the first region; a metal trace ground contact extending from the metal trace ground line to below an upper surface of the substrate to electrically contact the first ground well;
    wherein the first ground well is disposed in the substrate below the metal trace ground line so as to provide a low resistance path for free carriers from the first region of the substrate to the metal trace ground line.

2. The device of claim 1, further comprising a transfer transistor having a drain region, wherein the first ground well is separate from the drain region.

3. The device of claim 2, wherein at least a portion of the first ground well is disposed under the drain region.

4. The device of claim 3, wherein the first ground well is separated from the metal trace ground line.

5. The device of claim 3, further comprising a second ground well disposed between the first ground well and the metal trace ground line, the second ground well having a lower resistance than the first ground well.

6. The device of claim 5, further comprising a third ground well disposed between the second ground well and the metal trace ground line, the third ground well having a lower resistance than the second ground well.

7. The device of claim 1, wherein the substrate is doped with a p-type dopant, and wherein the first ground well is doped with a p-type dopant to have a resistance lower than the resistance of the substrate.

8. A device comprising:
    a substrate having at least one photosensor disposed therein;
    at least one drain region disposed in the substrate, each said at least one drain region associated with a corresponding one of the at least one photosensor;
    a first ground well in the substrate and separate from the at least one drain region and separate from the at least one photosensor, the first ground well doped to have a resistance lower than a resistance of the substrate; and
    a metal trace ground contact in a dielectric layer on an upper surface of the substrate away from the at least one photosensor; the metal trace ground contact extending below an upper surface of the substrate to electrically contact the first ground well.

9. The device of claim 8, further comprising a second ground well disposed such that the first ground well is between the second ground well and the metal trace ground contact, the second ground well doped to have a lower resistance than the resistance of the substrate and a higher resistance than the resistance of the first ground well.

10. The device of claim 9, further comprising a third ground well disposed such that the second ground well is between the third ground well and the metal trace ground contact, the third ground well doped to have a lower resistance than the resistance of the substrate and a higher resistance than the resistance of the second ground well.

11. The device of claim 10, wherein the metal trace ground contact contacts the first ground well.

12. The device of claim 11, wherein the substrate is a p-type semiconductor, and wherein the first ground well, the second ground well and the third ground well are doped with a p-type dopant.

13. The device of claim 11, wherein at least one of the third ground well and the second ground well are doped with a different material than the first ground well.

14. The device of claim 8, wherein the first ground well is doped to have a resistance gradient with a lowest resistance nearest the metal trace ground contact.

15. A method of forming a device comprising:
- forming a first ground well in a substrate, the first ground well having a resistance lower than a resistance of the substrate;
- forming a photosensor in a first region of the substrate and separate from the first ground well;
- forming a dielectric layer on the substrate; and
- forming a metal trace ground contact, the metal trace ground contact extending through the dielectric layer and into a region of the substrate adjacent to the first ground well, the metal trace ground contact disposed such that the first ground well provides a low resistance path for free carriers in the first region of the substrate to the metal trace ground contact; the metal trace ground contact electrically contacting the first ground well.

16. The method of claim 15, further comprising forming a second ground well between the first ground well and the metal trace ground contact, the second ground well doped to have a lower resistance than the resistance of the first ground well.

17. The method of claim 16, further comprising forming a third ground well between the second ground well and the metal trace ground contact, the third ground well doped to have a lower resistance than the resistance of the second ground well.

18. The method of claim 15, further comprising forming a drain region in the substrate and over at least a portion of the first ground well.

19. The method of claim 15, wherein forming the first ground well comprises epitaxially growing a doped semiconductor layer as a first ground well.

20. The device of claim 9, wherein the metal trace ground contact directly contacts the first ground well.

* * * * *